United States Patent
Chen et al.

(10) Patent No.: US 6,242,811 B1
(45) Date of Patent: Jun. 5, 2001

(54) INTERLEVEL CONTACT INCLUDING ALUMINUM-REFRACTORY METAL ALLOY FORMED DURING ALUMINUM DEPOSITION AT AN ELEVATED TEMPERATURE

(75) Inventors: Fusen E. Chen, Dallas; Fu-Tai Liou, Carrollton; Timothy E. Turner, Roanoke; Che-Chia Wei, Plano; Yih-Shung Lin, Carrollton; Girish Anant Dixit, Dallas, all of TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/080,066

(22) Filed: May 15, 1998

Related U.S. Application Data

(62) Division of application No. 08/480,543, filed on Jun. 7, 1995, which is a division of application No. 08/124,836, filed on Sep. 21, 1993, now abandoned, which is a continuation of application No. 07/443,898, filed on Nov. 30, 1989, now abandoned.

(51) Int. Cl.[7] .......................... H01L 23/48; H01L 23/52; H01L 29/40
(52) U.S. Cl. .................. 257/765; 257/768; 257/771; 257/758; 257/763; 257/754
(58) Field of Search .................. 257/765, 768, 257/771, 758, 747, 740, 748, 516, 763, 915, 755, 754; 438/643, 660, 648, 649, 647, 664

(56) References Cited

U.S. PATENT DOCUMENTS

| | | |
|---|---|---|
| 3,158,504 | 11/1964 | Anderson ........................ 437/188 |
| 3,900,598 | 8/1975 | Hall et al. ........................ 437/195 |
| 4,107,726 | 8/1978 | Schilling ........................ 257/763 |
| 4,436,582 | 3/1984 | Saxena ........................ 437/192 |

(List continued on next page.)

FOREIGN PATENT DOCUMENTS

| | | |
|---|---|---|
| 0 107 259 | 5/1984 | (EP) . |
| 0 132 720 | 2/1985 | (EP) . |
| 0 137 701 | 4/1985 | (EP) . |

(List continued on next page.)

OTHER PUBLICATIONS

"TiN Metallization Barriers: From $1.2\mu$ to $0.35\mu$ Technology" Fabio Pintchovski and Ed Travis, Motorola, Inc., Austin, Texas, pp. 777–786, 1992 Materials Research Society.

"Development of Planarized Al–Sl Contact Filling Technology," Hisako Ono, et al., VMIC Conference, Jun. 1990, pp. 76–82.

"Aluminum Metallization for ULSI," Dipankar Pramanik et al., Solid State Technology, Mar. 1990, No. 3, Westford, MA, pp. 73–79.

(List continued on next page.)

*Primary Examiner*—Sara Crane
*Assistant Examiner*—Thien F. Tran
(74) *Attorney, Agent, or Firm*—Theodore E. Galanthay; Lisa K. Jorgenson; Daniel E. Venglarik

(57) ABSTRACT

Interlevel contacts in semiconductor integrated circuits are fabricated by formation of a contact opening through an insulating layer. A layer of refractory metal, or refractory metal alloy, is deposited over the surface of the integrated circuit chip. An aluminum layer is then deposited at a significantly elevated temperature, so that an aluminum/refractory metal alloy is formed at the interface between the aluminum layer and the refractory metal layer. Formation of such an alloy causes an expansion of the metal within the contact opening, thereby filling the contact opening and providing a smooth upper contour to the deposited aluminum layer.

11 Claims, 1 Drawing Sheet

U.S. PATENT DOCUMENTS

| | | | |
|---|---|---|---|
| 4,502,209 | 3/1985 | Eizenberg et al. | 437/190 |
| 4,566,177 | 1/1986 | van de Ven et al. | 437/194 |
| 4,592,802 | 6/1986 | Deleonibus et al. | 437/192 |
| 4,661,228 | 4/1987 | Mintz | 204/192.25 |
| 4,756,810 | 7/1988 | Lamont | 204/192.3 |
| 4,759,533 | 7/1988 | Magee et al. | 437/194 |
| 4,772,571 | 9/1988 | Scovell et al. | 437/197 |
| 4,837,183 | 6/1989 | Polito et al. | 437/197 |
| 4,892,844 | 1/1990 | Cheung et al. | 437/194 |
| 4,944,961 | 7/1990 | Lu | 427/314 |
| 4,970,176 | 11/1990 | Tracy et al. | 437/197 |
| 4,975,389 | 12/1990 | Ryan et al. | 437/197 |
| 4,976,839 | 12/1990 | Inoue | 204/192.17 |
| 4,988,423 | 1/1991 | Yamamoto et al. | 437/194 |
| 4,994,162 | 2/1991 | Armstrong et al. | 204/192.15 |
| 5,018,001 * | 5/1991 | Kondo et al. | 257/771 |
| 5,106,781 | 4/1992 | Penning de Vries | 437/194 |
| 5,108,570 | 4/1992 | Wang | 204/192.3 |
| 5,108,951 | 4/1992 | Chen et al. | 437/94 |
| 5,278,099 * | 1/1994 | Maeda | 438/643 |

FOREIGN PATENT DOCUMENTS

| | | | |
|---|---|---|---|
| 0 168 828 | 1/1986 | (EP) . | |
| 0 257 277 | 3/1988 | (EP) . | |
| 0 269 019 | 6/1988 | (EP) . | |
| 0 273 715 | 7/1988 | (EP) . | |
| 0 276 087 | 7/1988 | (EP) . | |
| 0 310 108 | 4/1989 | (EP) . | |
| 0 329 227 | 8/1989 | (EP) . | |
| 0 351 001 | 1/1990 | (EP) . | |
| 0 430 403 | 6/1991 | (EP) . | |
| 0 451 571 | 10/1991 | (EP) . | |
| 0 488 264 | 6/1992 | (EP) . | |
| 0 488 628 | 6/1992 | (EP) . | |
| 0 499 241 | 8/1992 | (EP) . | |
| 2 112 566 | 7/1983 | (GB) . | |
| 2 128 636 | 5/1984 | (GB) . | |
| 52-137 948 | 11/1977 | (JP) . | |
| 0 071 564 | 8/1979 | (JP) . | |
| 0 139 939 | 8/1982 | (JP) . | |
| 0 046 641 | 3/1983 | (JP) . | |
| 0 227 446 | 11/1985 | (JP) . | |
| 0 142 739 | 6/1986 | (JP) . | |
| 362241373A * | 10/1987 | (JP) | 257/754 |
| 0 124 447 | 5/1988 | (JP) . | |
| 0 136 547 | 6/1988 | (JP) . | |
| 63-142832 | 6/1988 | (JP) | H01L/21/88 |
| 0 137 230 | 11/1988 | (JP) . | |
| 0 160 036 | 6/1989 | (JP) . | |
| 62 232 334 | 7/1989 | (JP) . | |
| 077 122 | 9/1989 | (JP) . | |
| 5-74956 * | 3/1993 | (JP) . | |
| 6-302703 * | 10/1994 | (JP) . | |

OTHER PUBLICATIONS

"Thin–Film Reactions of Al with Co, Cr, Mo, Ta, Ti and W," E.G. Golgan, et al., vol. 4, 1989 Materials Research Society, pp. 815–820.

"Planarized Aluminum Depostion on TiW and TiN Layers by High Temperature Evaporation," G.E. Georgiou et al., AT&T Bell Laboratories, Jun. 1989 VMIC Conference, pp. 315–321.

"The Properties of Aluminum Thin Films Sputter Deposited at Elevated Temperatures," M. Inoue et al., J. Vac. Sci. Technol., May 6, 1998, pp. 1636–1939.

"Evaluation of Titanium as a Diffusion Barrier Between Aluminum and Silicon for 1.2 $\mu$m CMOS Integrated Circuits," M. Farahani et al., Electrochemical Society Active Member, pp. 2835–2845.

"Nonconformal Al Via Filling and Planarization by Partially Ionized Beam Deposition for Multilevel Interconnection," S.N. Mei et al., 1987 IEEE, pp. 503–505.

"Aluminum Alloy Planarization for Topography Control of Multi–Level VLSI Interconnect," van Gogh et al., 1987, IEEE, pp. 371–375.

"Interconnect Materials for VLSI Circuits," Y. Pauleau, Centre National d'Etudes des Telecommunications, Meylan, France, 1987, pp. 155–162, Solid State Technology.

"Planarization of Al Alloy Film During High Rate Sputtering," V. Hoffman et al., Mar. 1986, Report No. 122, pp. 1–20.

"Sputtering and Interconnect Trends," Peter Burggraaf, Semiconductor International , Nov. 1984, pp. 70–73.

"TiN Formed by Evaporation as a Diffusion Barrier Between Al and Si," C.Y. Ting, IBM T.J. Watson Research Center, Yorktown Heights, New York 10598, May 6, 1982, pp. 14–18.

"High–Temperature Contact Structures for Silicon Semiconductor Devices," M. Wittmer, Brown Boveri Research Center, 5405 Baden–Dattwil, Switzerland, 9/80 pp. 540–542.

"Silicon Processing for the VLSI Era," S. Wolf et al., Lattice Press, Inc., 1986, pp. 332–334.

* cited by examiner

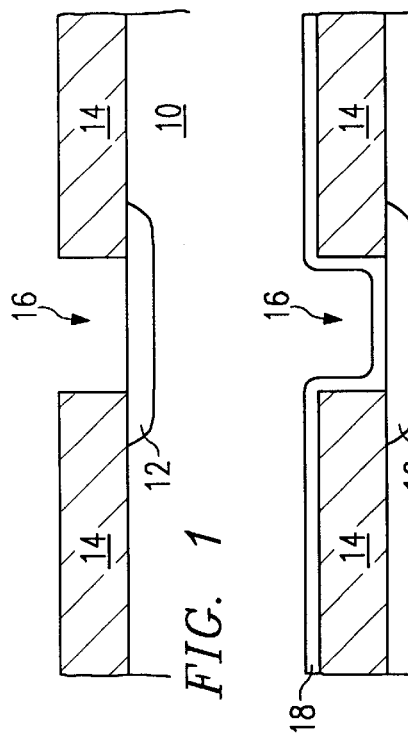
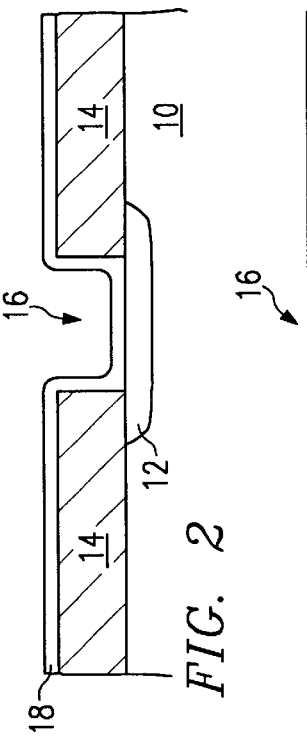
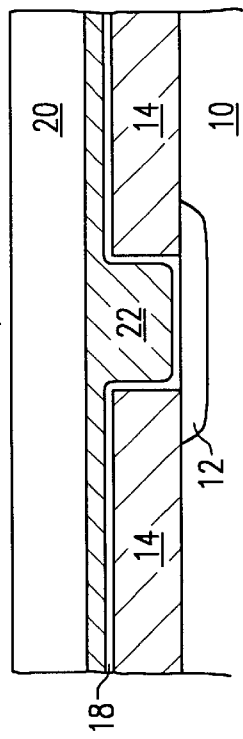
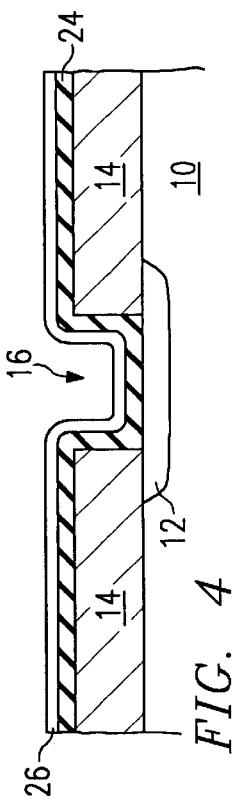
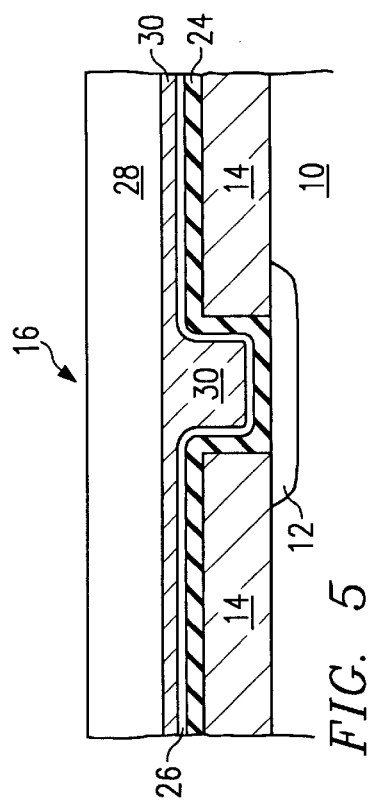
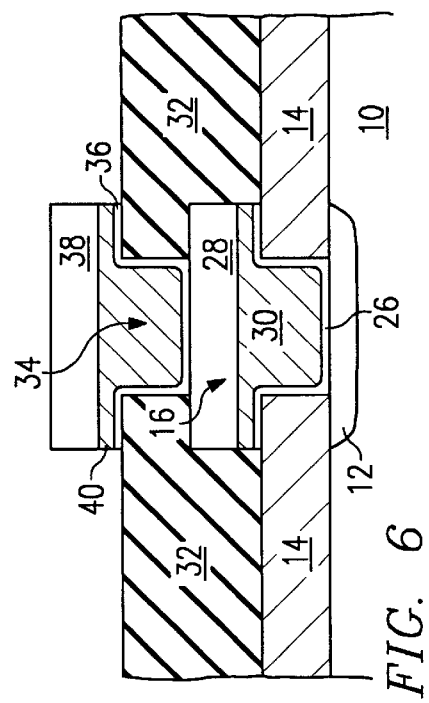

INTERLEVEL CONTACT INCLUDING ALUMINUM-REFRACTORY METAL ALLOY FORMED DURING ALUMINUM DEPOSITION AT AN ELEVATED TEMPERATURE

This is a division of application Ser. No. 08/480,543, filed Jun. 7, 1995, which is a division of application Ser. No. 08/124,836, filed Sep. 21, 1993, now abandoned, which is a continuation of application Ser. No. 07/443,898, filed Nov. 30, 1989, now abandoned.

BACKGROUND OF THE INVENTION

1. Field of the Invention

The present invention relates generally to integrated circuit fabrication, and more specifically to a method for fabricating interlevel contacts.

2. Description of the Prior Art

Aluminum is used extensively in the field of semiconductor integrated circuit fabrication for providing interconnect between various portions of an integrated circuit chip. Aluminum has several important advantages which make it the conductor of choice for many applications. Among the properties which make aluminum so useful is the fact that it is very conductive, it forms a good mechanical bond with various dielectric layers generally used in a semiconductor industry, and it makes a good ohmic contact with both N and P type semiconductors.

Aluminum also has several important drawbacks which must be overcome when fabricating integrated circuits. Aluminum forms fairly low temperature alloys. As a result, its rate of self-diffusion can be significant at temperatures which fall within the expected operating range of the semiconductor circuits in which it is included. This movement of aluminum atoms is especially severe if the aluminum interconnect carries relatively high current densities. This phenomenon is known as "electromigration," and can cause premature failure of semiconductor devices. To prevent failures due to electromigration, semiconductors must be designed so that the current density in aluminum lines does not become enough to cause rapid electromigration.

Electromigration problems can become especially severe when aluminum interconnect lines cross abrupt height changes on the surface of an integrated circuit. Such abrupt changes are generally referred to as steps. Thinning of aluminum interconnect lines tends to occur over such steps, increasing current density at these locations and making the device more susceptible to electromigration problems.

Step coverage problems are common when small openings are made through a relatively thick dielectric layer to allow contact with conductive regions beneath. These problems are especially severe with sub-micron device geometries. Contact openings, also referred to as vias, can be made to contact an underlying active region within a semiconductor substrate, or to contact an underlying polycrystalline silicon or metal interconnect layer. The sputter deposition or evaporation techniques used to form aluminum thin film layers produces a much thinner layer of metal along the edges of such an aperture due to a self-shadowing phenomenon. The higher current densities found in the thinner sidewalls can contribute to significant electromigration problems for an integrated circuit device.

Present techniques for minimizing step coverage problems through small apertures include creating apertures having sloped sidewalls and filling the contact opening with a refractory metal alloy. Creating sloped sidewalls on the contact openings increases their overall size, which limits device density. This is especially important for submicron devices. Filling the contact opening with a refractory metal alloy adds significant complexity to present process flows. Both of these techniques also tend to result in an uneven upper surface, making it difficult to stack contacts one above another.

Another proposed technique for filling contact openings is to deposit a thin layer of aluminum at a low temperature, substantially room temperature, followed by deposition of a thick aluminum layer at 400° C. or higher. Such an approach is believed to be difficult to perform, and results in contact openings which are still not completely filled. A thick aluminum layer must be used, and spiking problems can occur.

It would be desirable for a technique for manufacturing integrated circuits to provide for completely filling contact openings with a conductive material. It would be further desirable for such a technique to be simple and compatible with current processing technology.

SUMMARY OF THE INVENTION

It is therefore an object of the present invention to provide a semiconductor integrated circuit manufacturing method which causes contact openings to be completely filled with a conductive material.

It is a further object of the present invention to provide such a method which is suitable for use at geometries of less than one micron.

It is another object of the present invention to provide such a method which adds a minimal amount of complexity to current semiconductor processing techniques.

It is yet another object of the present invention to provide such a method which can easily be incorporated into existing integrated circuit process flows.

Therefore, according to the present invention, a method for fabricating interlevel contacts in semiconductor integrated circuits provides for formation of a contact opening through an insulating layer. A layer containing a refractory metal, or a refractory metal alloy, is deposited over the surface of the integrated circuit chip. An aluminum layer is then deposited at a significantly elevated temperature, so that an aluminum/refractory metal alloy is formed at the interface between the aluminum layer and the refractory metal layer. Formation of such an alloy causes an expansion of the metal within the contact opening, thereby helping to fill the contact opening and providing a smooth upper contour to the deposited aluminum layer.

BRIEF DESCRIPTION OF THE DRAWING

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIGS. 1 through 3 illustrate a preferred method for fabricating an interlevel contact according to the present invention;

FIGS. 4 and 5 illustrate an alternative method for forming an interlevel contact according to the present invention; and FIG. 6 is a cross-section of a portion of an integrated circuit illustrating formation of a second contact through an opening in a dielectric layer immediately above a first interlevel contact.

DETAILED DESCRIPTION OF THE INVENTION

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. FIGS. 1–6 represent a cross-section of a portion of an integrated circuit during fabrication. The figures are not drawn to scale, but instead are drawn so as to illustrate the important features of the invention.

Referring to FIG. 1, a substrate 10 includes an active region 12 such as a source/drain region of a field effect transistor. A dielectric layer 14, such as silicon dioxide ($SiO_2$) is formed over the surface of the substrate 10. An opening 16 is formed in the dielectric layer 14 in order to allow an upper level conductor to make contact with the active region 12.

Referring to FIG. 2, a thin layer of refractory metal 18 is deposited over the surface of the integrated circuit. This layer 18 can have a thickness varying from approximately 100 angstroms to more than 3,000 angstroms. The layer may consist of a refractory metal such as titanium, molybdenum, or niobium. Alternatively, an alloy or compound containing a refractory metal, such as titanium/tungsten, titanium nitride, or molybdenum silicide.

Referring to FIG. 3, a layer of aluminum 20 is then deposited over the surface of the chip. This layer is deposited at an elevated temperature of at least approximately 150° C. A higher deposition rate of aluminum can be used at higher temperatures, so the aluminum layer 20 is preferably deposited at a temperature between approximately 350° C. and 500° C. preferably at a rate of approximately 20–200 A/sec. In addition, the higher deposition temperatures increase the surface mobility of the deposited aluminum, increasing the amount of aluminum deposited in the contact opening 16.

Depositing the aluminum layer 20 at such an elevated temperature causes it to alloy with the refractory metal layer 18 to form an aluminum/refractory metal alloy layer 22. The volume of the aluminum/refractory metal alloy is greater than the volume of the aluminum and refractory metal separately, so that voids within the contact opening 16 are filled by the expanding alloy. The area of the interface between the aluminum layer 20 and the refractory metal layer 18 is greater within the contact opening 16 due to its three-dimensional nature. Therefore, more aluminum/refractory metal alloy is formed within the contact opening 16. Since the alloy has a greater volume than the aluminum and refractory metal separately, the contact opening is filled to an extent which tends to level the upper surface of the aluminum layer 20. This provides for a relatively flat upper surface for aluminum layer 20, and this effect tends to improve the planarity of aluminum layer 20 to a greater degree as the width of contact opening 16 decreases. Thus, the present technique is especially suitable for use with contact openings having dimensions of less than one micron.

FIG. 3 shows the aluminum/refractory metal alloy 22 as completely filling the contact opening 16. However, this is not always the case, as the aluminum layer 20 may extend into the opening 16. The alloy formed in the contact opening improves the planarity of the aluminum layer 20 even if it does not completely fill the opening 16.

Referring to FIG. 4, an alternative embodiment of the present method is shown. After the contact opening 16 has been formed, a layer of refractory metal such as titanium is deposited and reacted as known in the art to form a layer of metal silicide 24. Following formation of the silicide layer 24, another thin layer 26 of refractory metal is deposited over the surface of the chip.

Several alternatives exist for formation of the refractory metal containing layer 24 and layer 26. As described in connection with FIG. 2, a layer of refractory metal only, such as titanium or tungsten, can be used. A sandwich structure of refractory metal/refractory metal compound/refractory metal can be used, such as Ti/TiN/Ti. A sandwich of refractory metal silicide/refractory metal compound/refractory metal can also be used, such as $TiSi_x$/TiN/Ti. The upper surface of the refractory metal-containing layer should have enough refractory metal available to alloy with the aluminum.

Referring to FIG. 5, an aluminum layer 28 is deposited over the chip at the elevated temperatures described above. This forms an aluminum/refractory metal layer 30 as before. Layer 26 is deposited over the chip because the silicided layer 24 does not have enough unalloyed refractory metal to combine with the aluminum layer 28 to the degree desired. Other layers of refractory metal compounds, such as titanium nitride, also preferably incorporate the deposition of an additional refractory metal layer 26 as described in FIGS. 4 and 5.

Since the alloying caused by the presently described technique results in a significant improvement in planarity of the aluminum layer of interconnect, it is possible to fabricate two or more contacts stacked one above the other. Such a stacked contact is shown in FIG. 6.

After formation of aluminum layer 20 as described in connection with FIG. 3, the interconnect layer is patterned as known in the art. A dielectric layer 32 is then formed over the surface of the chip and planarized. An opening 34 is formed in dielectric layer 32, followed by deposition of a refractory metal layer 36 over the surface of the chip. An aluminum layer 38 is deposited, as before, at an elevated temperature, causing formation of an aluminum/refractory metal alloy 40. This forms a second level of metal interconnect, which is then patterned to give the structure shown in FIG. 6.

If desired, a third metal interconnect layer can be fabricated on top of the structure shown in FIG. 6 using the techniques described above. Due to the planarization caused by the described technique, multiple interconnect levels are more easily fabricated than has been the case in the past. This allows for complex signal routing to be performed using metal interconnect layers, which becomes more and more desirable as device densities increase.

Since the contact openings become completely filled with an aluminum/refractory metal alloy, aluminum step coverage problems at such contact openings are virtually eliminated. The aluminum/refractory metal alloy is more resistant to electromigration, and overall current densities remain relatively low since the contact opening is completely filled.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

What is claimed is:

1. A semiconductor structure, comprising:

an insulating layer overlying a conductive region;

an opening formed in the insulating layer and exposing a portion of the conductive region;

a refractory metal layer consisting of a refractory metal overlying the insulating layer, sidewalls of the opening, and the exposed portion of the conductive region;

an alloy layer consisting of an alloy of aluminum and the refractory metal on the refractory metal layer and within the opening, wherein the refractory metal layer, the alloy layer and any layers beneath the refractory metal layer within the opening fill the opening; and a layer of aluminum an the alloy layer.

2. The semiconductor structure of claim 1, further comprising:

a refractory metal silicide layer consisting of a silicide of the refractory metal underlying the refractory metal layer.

3. The semiconductor structure of claim 1, further comprising:

a refractory metal nitride layer consisting of a nitride of the refractory metal underlying the refractory metal layer.

4. The semiconductor structure of claim 1, further comprising:

a second insulating layer covering the aluminum layer and the insulating layer overlying the conductive region;

a second opening in the second insulating layer, wherein the second opening exposes a portion of the aluminum layer;

a second refractory metal layer consisting of a refractory metal overlying the second insulating layer, sidewalls of the second opening, and the exposed portion of the aluminum layer;

a second alloy layer consisting of an alloy of aluminum and the refractory metal on the second refractory metal layer and within the second opening, wherein the second refractory metal layer and the second alloy layer fill any portion of the opening which is not filled by any layers beneath the second refractory metal layer within the second opening; and a second layer of aluminum on the second alloy layer.

5. An interlevel contact structure, comprising:

an insulating layer overlying a conductive region and having an opening therethrough exposing a portion of the conductive region;

a refractory metal layer consisting of a refractory metal over the insulating layer and within the opening;

an alloy layer consisting of aluminum and the refractory metal on the refractory metal layer and within the opening, wherein the refractory metal layer and the alloy layer fill any portion of the opening which is not filled by any layers beneath the refractory metal layer within the opening; and an aluminum layer on the alloy layer.

6. The interlevel contact structure of claim 5, further comprising:

a refractory metal silicide layer consisting of a silicide of the refractory metal underlying the refractory metal layer.

7. The interlevel contact structure of claim 5, further comprising:

a refractory metal silicide layer consisting of a silicide of the refractory metal underlying the refractory metal layer; and a refractory metal compound layer consisting of a compound of the refractory metal on the refractory metal silicide layer and underlying the refractory metal layer.

8. The interlevel contact structure of claim 7, further comprising:

a titanium silicide layer underlying the refractory metal layer;

a titanium nitride layer on the titanium silicide layer and underlying the refractory metal layer; and a titanium layer on the titanium nitride layer forming the refractory metal layer, wherein the refractory metal is titanium.

9. The interlevel contact structure of claim 5, further comprising:

a refractory metal nitride layer consisting of a nitride of the refractory metal underlying the refractory metal.

10. The interlevel contact structure of claim 5, further comprising:

a second refractory metal layer consisting of the refractory metal underlying the refractory metal layer;

a refractory metal compound layer consisting of a compound of the refractory metal on the second refractory metal layer and underlying the refractory metal layer.

11. The interlevel contact structure of claim 10, further comprising:

a titanium layer underlying the refractory metal layer;

a titanium nitride layer on the titanium layer and underlying the refractory metal layer; and a second titanium layer on the titanium nitride layer and forming the refractory metal layer, wherein the refractory metal is titanium.

* * * * *